United States Patent
Kanamori et al.

(10) Patent No.: US 8,603,920 B2
(45) Date of Patent: Dec. 10, 2013

(54) MANUFACTURING METHOD OF SEMICONDUCTOR DEVICE INCLUDING ETCHING STEP

(75) Inventors: Katsuhiko Kanamori, Nukata-gun (JP); Masashi Totokawa, Nagoya (JP); Hiroshi Tanaka, Toyokawa (JP)

(73) Assignee: DENSO CORPORATION, Kariya (JP)

( * ) Notice: Subject to any disclaimer, the term of this patent is extended or adjusted under 35 U.S.C. 154(b) by 408 days.

(21) Appl. No.: 12/805,569

(22) Filed: Aug. 5, 2010

(65) Prior Publication Data

US 2011/0034031 A1 Feb. 10, 2011

(30) Foreign Application Priority Data

Aug. 7, 2009 (JP) .................................. 2009-184969

(51) Int. Cl.
*H01L 21/302* (2006.01)
*H01L 21/461* (2006.01)

(52) U.S. Cl.
USPC .......... 438/705; 219/121.69; 216/63; 216/87; 216/62; 438/48

(58) Field of Classification Search
USPC ............ 73/754; 438/795, 766, 739, 733, 705, 438/585, 53, 515, 475, 462, 460, 31, 297, 438/21, 197, 166, 155; 427/10; 385/49; 359/290; 347/65, 61; 340/572.1; 29/890.1; 219/121.68; 216/99, 87, 41, 216/27; 156/345.5; 136/255; 117/8; 101/450.1
See application file for complete search history.

(56) References Cited

U.S. PATENT DOCUMENTS

| | | | |
|---|---|---|---|
| 6,240,782 B1 * | 6/2001 | Kato et al. | 73/514.32 |
| 6,992,026 B2 | 1/2006 | Fukuyo et al. | |
| 2003/0032227 A1 * | 2/2003 | Ohara et al. | 438/197 |
| 2004/0108805 A1 * | 6/2004 | Derraa | 313/495 |
| 2009/0065481 A1 * | 3/2009 | Kishimoto et al. | 216/87 |

FOREIGN PATENT DOCUMENTS

| | | |
|---|---|---|
| JP | A-S59-182529 | 10/1984 |
| JP | 7-240395 A | 9/1995 |
| JP | 2002-239769 A | 8/2002 |
| JP | A-2002-231966 | 8/2002 |
| JP | 2003-305697 A | 10/2003 |
| JP | 2004-160618 A | 6/2004 |
| JP | 2006-289442 A | 10/2006 |
| JP | A-2007-187608 | 7/2007 |
| JP | 2008-264902 A | 11/2008 |
| JP | A-2009-111147 | 5/2009 |

OTHER PUBLICATIONS

Machine translation of Furuichi et al. JP-2009-111147, published May 21, 2009, translated Oct. 31, 2012.*

(Continued)

*Primary Examiner* — Duy Deo
*Assistant Examiner* — Erin Bergner
(74) *Attorney, Agent, or Firm* — Posz Law Group, PLC

(57) ABSTRACT

A manufacturing method of a semiconductor device includes: irradiating a laser beam on a single crystal silicon substrate, and scanning the laser beam on the substrate so that a portion of the substrate is poly crystallized, wherein at least a part of a poly crystallized portion of the substrate is exposed on a surface of the substrate; and etching the poly crystallized portion of the substrate with an etchant. In this case, a process time is improved.

9 Claims, 9 Drawing Sheets

(56) References Cited

OTHER PUBLICATIONS

Tan et al., Localized laser assisted eutectic bonding of quartz and silicon by Nd:YAG pulsed-laser, 2005, Sensors and Actuators, A 120, pp. 550-561.*

Office Action mailed on Jun. 21, 2011 in the corresponding Japanese patent application No. 2009-184969 (English translation enclosed).
Office Action mailed Oct. 11, 2011 in corresponding JP application No. 2009-184969 (and English translation).

* cited by examiner

MANUFACTURING METHOD OF SEMICONDUCTOR DEVICE INCLUDING ETCHING STEP

CROSS REFERENCE TO RELATED APPLICATION

This application is based on Japanese Patent Application No. 2009-184969 filed on Aug. 7, 2009, the disclosure of which is incorporated herein by reference.

FIELD OF THE INVENTION

The present invention relates to a manufacturing method of a semiconductor device including an etching step.

BACKGROUND OF THE INVENTION

Conventionally, JP-A-2008-264902 teaches a manufacturing method of a semiconductor device including an etching step for etching single crystal silicon.

In the above manufacturing method, a SOI substrate including a base layer made of single crystal silicon, an intermediate layer made of oxide silicon and an upper layer made of single crystal silicon, which are stacked in this order, is used. An oxide film patterned on the surface of the upper layer is used as a mask. Then, the upper layer is etched so as to reach the intermediate layer. Then, the intermediate layer is etched with using an etchant such as HF acid.

Accordingly, in the above manufacturing method, it is necessary to etch the intermediate layer in a lateral direction of thereof, which is parallel to the surface of the base layer, and further, to etch the upper layer in a depth direction, which is perpendicular to the surface of the base layer, so that a movable portion and a fixed portion are formed. However, since an etching rate of the intermediate layer made of oxide silicon is low, and the upper layer made of single crystal silicon is directly etched, it is difficult to improve the etching speed.

SUMMARY OF THE INVENTION

In view of the above-described problem, it is an object of the present disclosure to provide a manufacturing method of a semiconductor device including an etching step. The device is made of single crystal silicon substrate. An etching speed of the manufacturing method is improved.

According to an aspect of the present disclosure, a manufacturing method of a semiconductor device includes: irradiating a laser beam on a single crystal silicon substrate, and scanning the laser beam on the substrate so that a portion of the substrate is poly crystallized, wherein at least a part of a poly crystallized portion of the substrate is exposed on a surface of the substrate; and etching the poly crystallized portion of the substrate with an etchant.

In the above case, the poly crystallized portion has a penetration speed and an adsorption speed of the etchant, which are higher than a single crystal silicon portion of the substrate. Accordingly, an etching speed is improved so that a manufacturing time is shortened.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
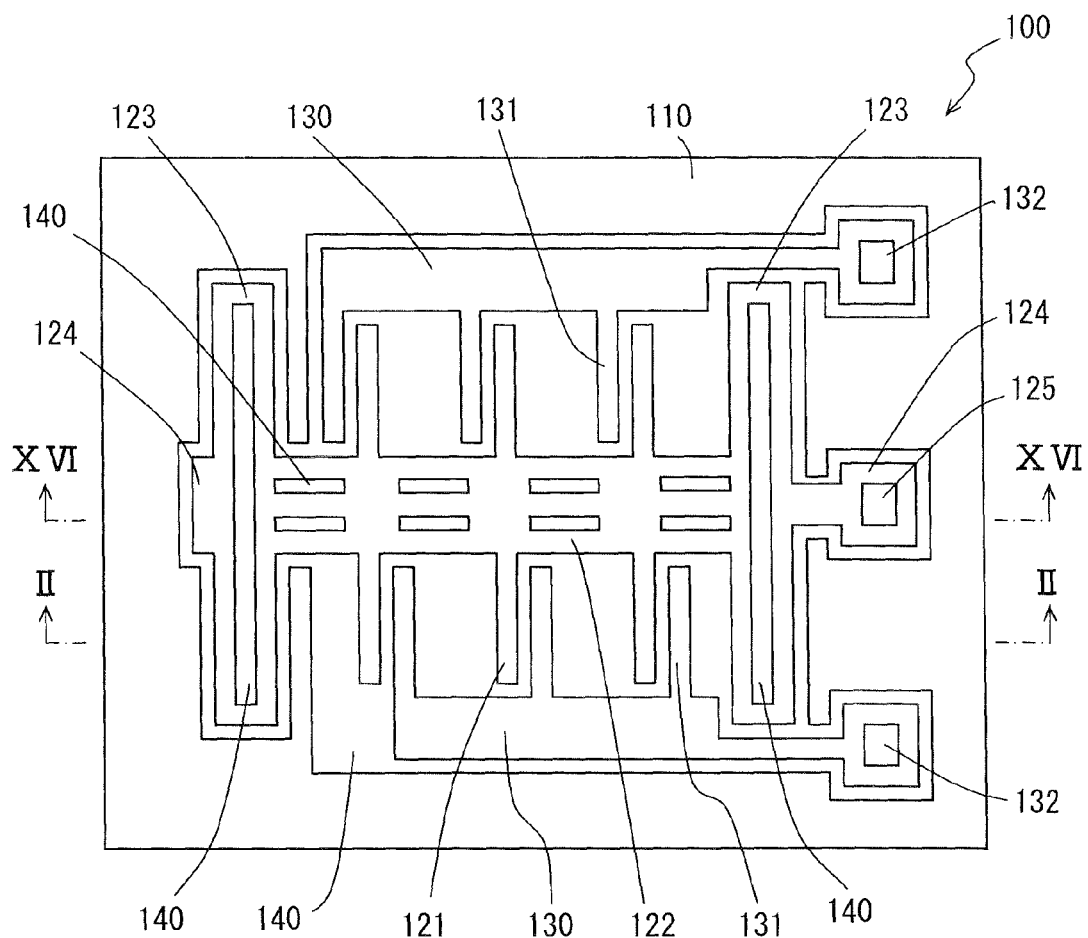
FIG. 1 is a diagram showing a plan view of a semiconductor device according to an example embodiment.

A physical quantity semiconductor sensor is manufactured by a manufacturing method according to an example embodiment. the sensor includes a movable portion, which is movable along with a predetermined direction according to a physical quantity applied to the sensor. Specifically, as shown in FIG. 1, the sensor is a capacitive acceleration sensor 100 for detecting acceleration. The sensor may be any sensor as long as the sensor includes a movable portion along with a predetermined direction according to a physical quantity. The sensor may be a MEMS device. For example, the sensor may be a capacitive angular speed sensor, a vibration sensor, a microphone, a micro scanner and the like.

Figure 2:
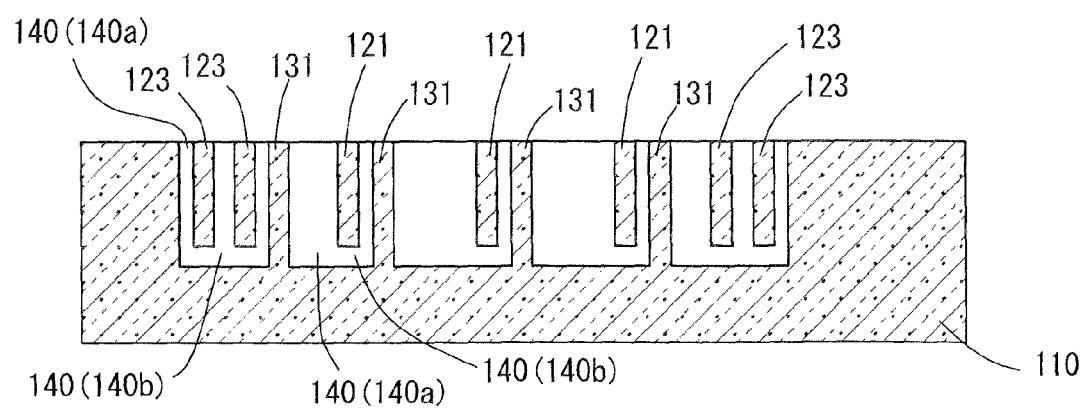
FIG. 2 is a diagram showing a cross sectional view of the device taken along line II-II in FIG. 1.

As shown in FIGS. 1 and 2, the sensor 100 is made of a single crystal silicon substrate 110 having a movable portion and a fixed portion. Here, the substrate 110 is a single, i.e., one integrated substrate. Thus, the movable portion and the fixed portion are integrally formed in the single crystal silicon substrate 110. The movable portion and the fixed portion are surrounded with an etched portion 140 with a trench 140a, which is formed by etching the substrate 110 in a depth direction perpendicular to the surface of the substrate 110.

The movable portion is movable, i.e., displaceable with respect to the substrate 110 since the movable portion is separated from the substrate 110 through a release portion 140b and a trench 140a. The release portion 140b is a part of the etched portion 140, which is prepared by etching the substrate 110 in a lateral direction, which is in parallel to the surface of the substrate 110. The trench 140a is a part of the etched portion 140, which is prepared by etching the substrate 110 in the depth direction, which is perpendicular to the surface of the substrate 110. The movable portion is movable in a predetermined direction, i.e., a right-left direction of FIG. 1 according to the physical quantity, i.e., the acceleration. The movable portion is a beam structure, which is separated from the substrate 110 with the etched portion 140. The movable portion includes a movable electrode 121, a weight portion 122 and a spring portion 123.

The weight portion 122 as a mass to which the acceleration is applied has an outline of a planar rectangular shape. To remove easily a part of the substrate 110 under the weight portion 122 in an etching process, a through hole 140 as a part of the etched portion 140 is formed in the weight portion 122. The weight portion 122 is separated from a bottom of the substrate 110 via the release portion 140b, which is etched and removed from the substrate 110. Accordingly, the through hole 140 in the weight portion 122 penetrates the weight portion 122 to reach the release portion 140b. Thus, the through hole 140 is formed on the surface of the substrate 110.

In the present embodiment, a part of the substrate 110 to be etched is poly crystallized by laser beam irradiation, and then, the part is etched. Thus, the release portion 140b is easily formed. Specifically, when a part of the substrate 110, which is to be the release portion 140b and made of poly crystal silicon, contacts a poly crystallized portion exposed outside of the substrate 110, the release portion 140b is easily formed. Accordingly, it is not necessary to form the through hole 140 in the weight portion 122.

The movable electrode 121 protrudes from a side of the weight portion 122, which is perpendicular to a displacement direction, i.e., a movable direction. In the present embodiment, the sensor 100 includes three movable electrodes 121, which protrudes from each side of the weight portion 122. Each end of the weight portion 122 in the displacement direction is connected to the spring portion 123 having a beam structure with a rectangular frame shape. Each spring portion 123 is connected to an anchor 124 as a support portion for supporting the movable portion.

The movable portion has a beam structure, which includes a beam for providing the movable electrode 121, a beam for providing the weight portion 122 and a beam for providing the spring portion 123. Both ends of the beam structure of the movable portion are fixed to the anchor 124. Specifically, the movable electrode 121, the weight portion 122, and the spring portion 123 are supported by the anchor 124 so that the movable electrode 121, the weight portion 122, and the spring portion 123 are floated from, i.e., separated from the bottom of the release portion 140b, which is prepared by etching the substrate 110.

A pad 125 for the movable electrode 121 is formed on one of the anchors 124. The pad 125 is formed by patterning a metal film such as an aluminum film.

Each of the fixed portion 130 includes a fixed electrode 131, a pad 132 for the fixed electrode 131 and a connection portion for coupling between the fixed electrode 131 and the pad 132. The connection portion in each fixed portion 130 functions as a wire for electrically connecting between the fixed electrode 131 and a corresponding pad 132 for the fixed electrode 131.

Each fixed portion 130 is partitioned with the trench 140a as a part of the etched portion 140, which is prepared by etching the substrate 110 in the depth direction. A part of the fixed portion 130 functioning as the wire is arranged in parallel to the weight portion 122. The fixed electrode 131 extending from the part of the fixed portion 130 is in parallel to the movable electrode 121, and the fixed electrode 131 faces the movable electrode 121. A predetermined distance, i.e., a predetermined detection clearance is formed between the fixed electrode 131 and the movable electrode 121.

The number of the fixed electrodes 131 is the same as the number of the movable electrodes 121. When the acceleration is applied to the sensor 100, the capacitance of one of capacitors formed between the fixed electrode 131 and the movable electrode 121 increases, and the capacitance of another one of the capacitors between the fixed electrode 131 and the movable electrode 121 decreases. Thus, the fixed electrodes 131 and the movable electrodes 121 provide a differential amplifying function.

Figure 3A:
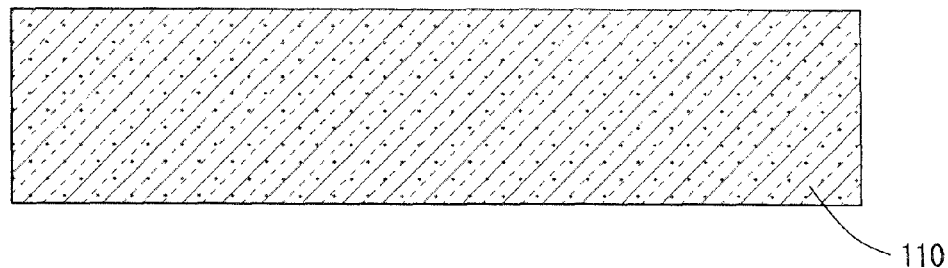
FIGS. 3A to 3C are diagrams showing a manufacturing method of the semiconductor device in FIG. 1.

Here, the manufacturing method of the sensor 100 will be explained with reference to FIGS. 3A to 3C. Firstly, as shown in FIG. 3A, the single crystal silicon substrate 110 is prepared.

Figure 3B:
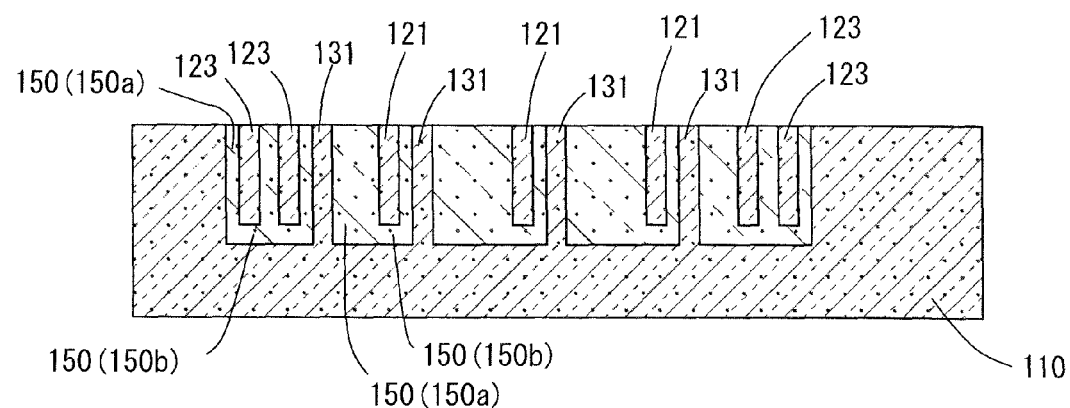
Figure 3C:
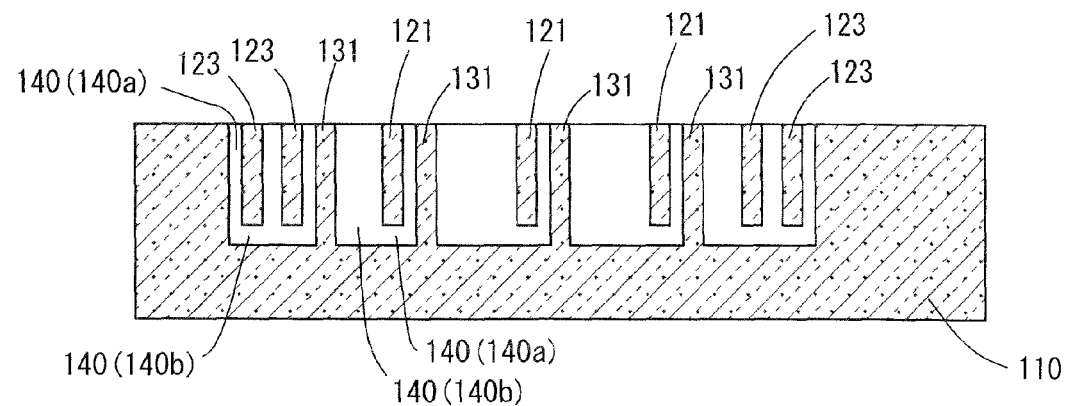

As shown in FIG. 3B, a laser beam L is irradiated on the substrate 110. The laser beam L is scanned to move a focus on the substrate 110 in a portion to be etched so that a part of the substrate 110 is poly crystallized. Thus, the inside of the substrate 110 is selectively poly crystallized so as to expose at least a portion of the poly crystallized part on the surface of the substrate 110. This step is defined as a reforming step so that a reformed portion 150a for providing the trench 140a and a reformed portion 150b for providing the release portion 140b are formed.

Specifically, a part of the substrate 110 which partitions the movable portion and the fixed portion 130 in the substrate 110 is polycristallized. Thus, the part of the substrate 110 around a movable-electrode-to-be-formed portion, a weight-portion-to-be-formed portion, a spring-portion-to-be-formed portion, an anchor-to-be-formed portion and a fixed-portion-to-be-formed portion is poly crystallized so that the reformed portion 150a for the trench 140a is formed. Further, a part of the substrate under a movable-electrode-to-be-formed portion, a weight-portion-to-be-formed portion and a spring-portion-to-be-formed portion is poly crystallized so that the reformed portion 150b for the release portion 140b is formed so as to connect to at least a part of the reformed portion 150a.

Here, the reformed portion 150 includes the reformed portion 150a for forming the trench 140a and the reformed portion 150b for forming the release portion 140b. Specifically, the reformed portion 150a is a part of the reformed portion 150 extending in the depth direction of the substrate 110, and the reformed portion 150b is a part of the reformed portion 150 extending in the lateral direction of the substrate 110.

Figure 4:
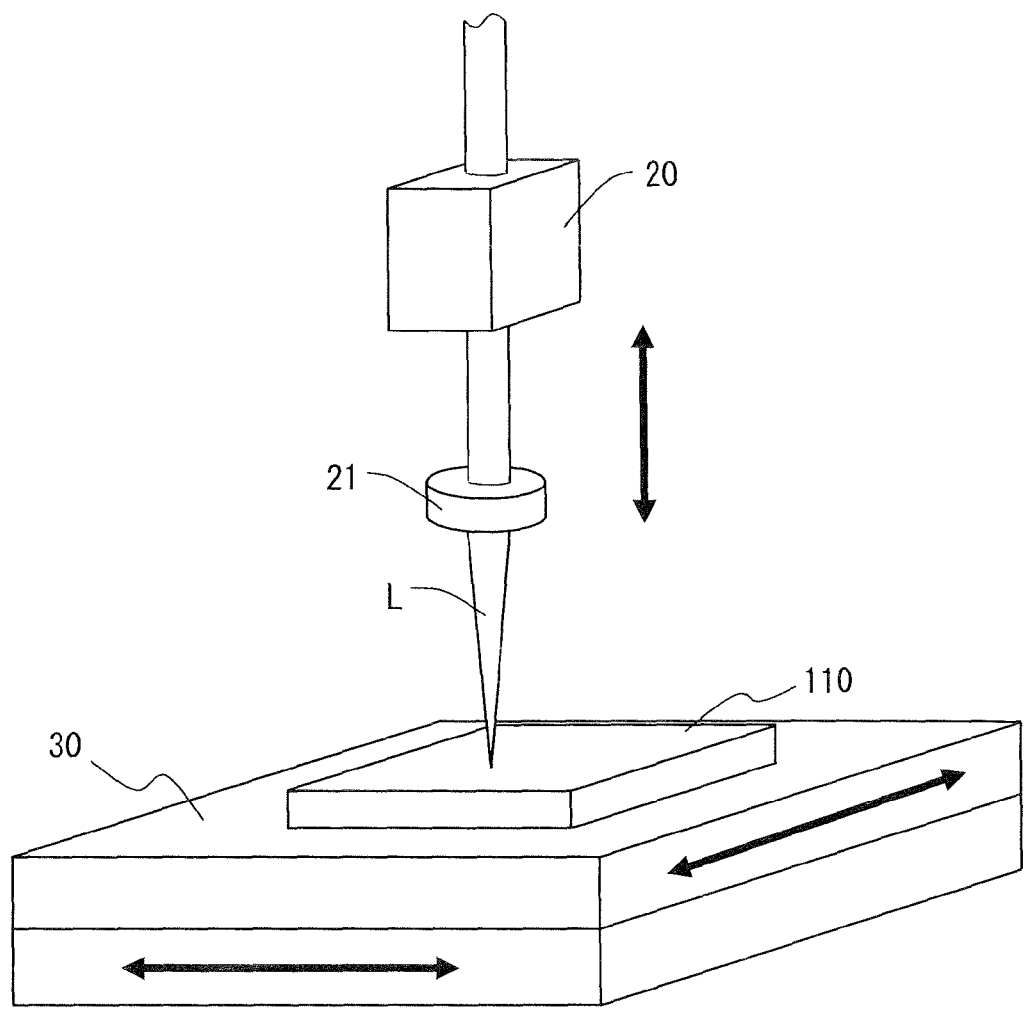
FIG. 4 is a diagram showing a perspective view of a manufacturing device according to the example embodiment.

In the reforming step, as shown in FIG. 4, a manufacturing device for executing the reforming step is used. The device includes a X-Y stage 30 and an optical element. The substrate 110 is mounted on the X-Y stage 30, and the substrate 110 is movable along a X-direction and a Y-direction on a X-Y plane, which is parallel to the surface of the substrate 110. The optical element includes a variable focus lens 20 and a condenser lens 21 so that the focus of the laser beam L irradiated on the substrate 110 from the upper side of the substrate 110 is adjustable in a Z-direction, which is perpendicular to the substrate 110 and parallel to the depth direction of the substrate 110.

Figure 6:
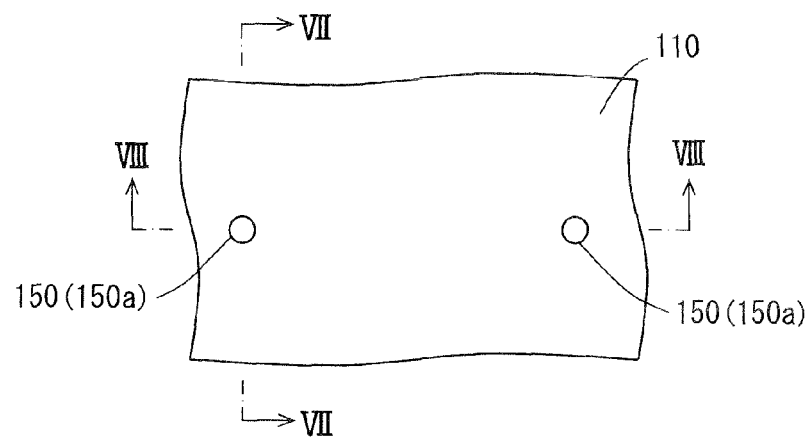
FIG. 6 is a diagram showing a plan view of a reformed portion of the single crystal silicon wafer in a depth direction.
Figure 7:
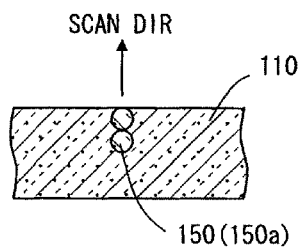
FIG. 7 is a diagram showing a cross sectional view of the reformed portion taken along line VII-VII in FIG. 6.
Figure 8:
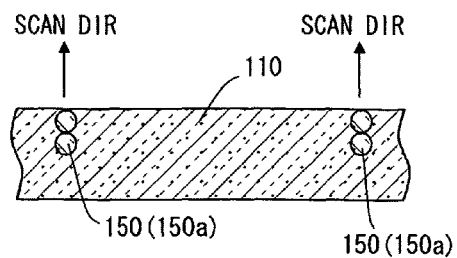
FIG. 8 is a diagram showing a cross sectional view of the reformed portion taken along line VIII-VIII in FIG. 6.

Here, the reforming step for forming the reformed portion 150a executed by the optical element and the X-Y stage 30 will be explained with reference to FIGS. 6 to 8. To simplify the explanation of the reforming step, a case where only the reformed portion 150a is formed in the substrate 110 will be explained. First, the X-Y stage 30 and/or the optical element are controlled so that a light emitting port of the laser beam L is positioned directly above a position of the substrate at which the trench 140a is formed. Then, the laser beam I is irradiated on the substrate 110, and the focus of the laser beam L is moved from a deep position in the substrate to the surface of the substrate 110 with using the variable focus lens 20 so that the reformed portion 150a is formed from the deep position to the surface of the substrate 110. Thus, the scanning direction of the laser beam L is perpendicular to the surface of the substrate 110. In case of FIGS. 7 and 8, the position of the focus of the laser beam L is changed twice in the depth direction of the substrate 110. Thus, two reformed portions 1508 are formed in the substrate 110 along with the depth direction.

Figure 9:
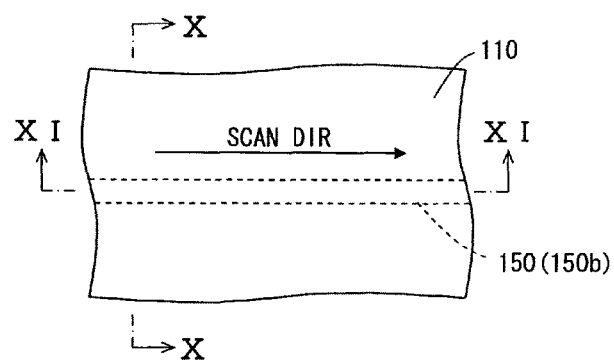
FIG. 9 is a diagram showing a plan view of a reformed portion of the single crystal silicon wafer in a lateral direction.
Figure 10:
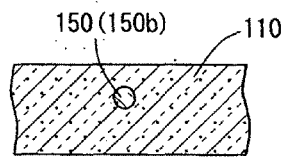
FIG. 10 is a diagram showing a cross sectional view of the reformed portion taken along line X-X in FIG. 9.
Figure 11:
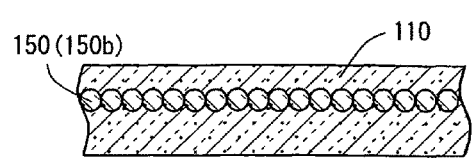
FIG. 11 is a diagram showing a cross sectional view of the reformed portion taken along line XI-XI in FIG. 9.

Next, the reforming step for forming the reformed portion 150b executed by the optical element and the X-Y stage 30 will be explained with reference to FIGS. 9 to 11. To simplify the explanation of the reforming step, a case where only the reformed portion 150b is formed in the substrate 110 will be explained. Actually, the reformed portion 150b connects to the reformed portion 150a, which is exposed on the surface of the substrate 110 so that the etchant penetrates into the reformed portions 150a, 150b.

First, the X-Y stage 30 and/or the optical element are controlled so that a light emitting port of the laser beam L is positioned directly above a position of the substrate from which the release portion 140b is formed. Further, the variable focus lens 20 is controlled to position the focus of the laser beam L at a predetermined depth of the substrate 110, at which the reformed portion 140b is formed.

Then, the laser beam L is irradiated on the substrate 110, and the substrate 110 is displaced with the X-Y stage 30, so that the focus of the laser beam L is moved along with a part of the substrate 110, at which the release portion 140b is formed. Thus, the scanning direction of the laser beam I is parallel to the surface of the substrate 110. In case of FIGS. 10 and 11, the position of the focus of the laser beam L is changed eighteen times along with the lateral direction of the substrate. Thus, eighteen reformed portions 150a are formed in the substrate 110 along with the lateral direction parallel to the surface of the substrate 110.

The X-Y stage 30 and the condenser lens 21 are well known. The variable focus lens 20 may be described in JP-A-2002-239769.

In the present embodiment, a device for moving the focus of the laser beam L three-dimensionally with respect to the substrate 110 includes the X-Y stage 30, the condenser lens 21, and the variable focus lens 20. Alternatively, the device may be any as long as the device moves the focus of the laser beam L relative to the substrate 110 so that the focus of the laser beam L is displaced three-dimensionally with respect to the substrate 110. When only the trench 140a is formed in the substrate 110, the device may move the focus of the laser beam L with respect to the substrate, and irradiates the laser beam L on the substrate 110 in the depth direction of the substrate 110.

Figure 5:
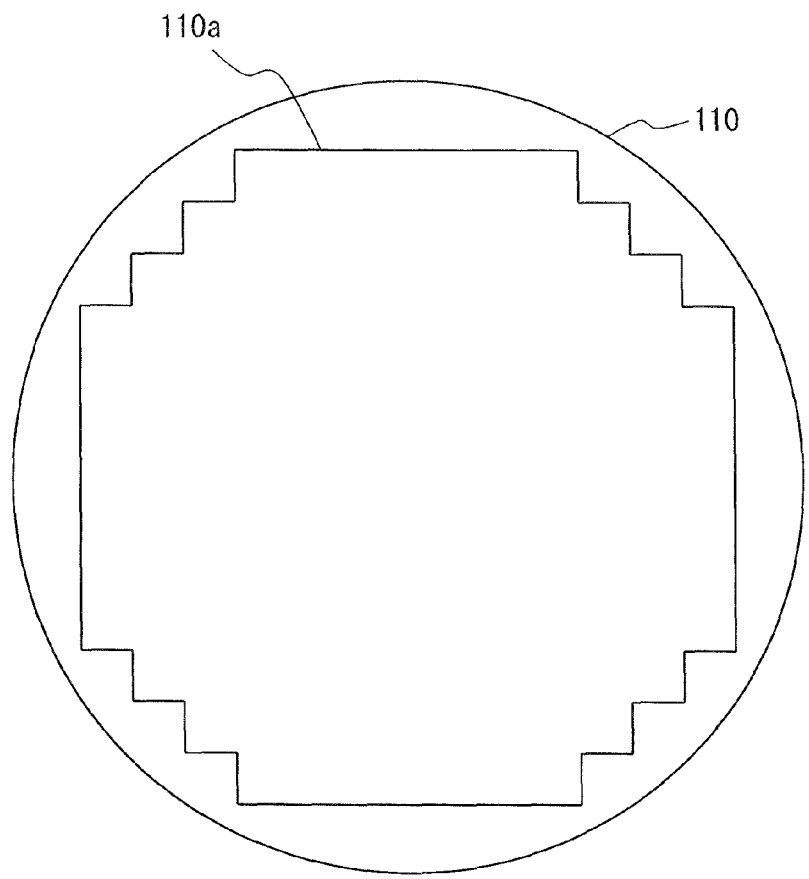
FIG. 5 is a diagram showing a plan view of a single crystal silicon wafer.

In FIG. 4, the substrate 110 has a rectangular shape. Alternatively, the substrate 110 may have any shape. For example, as shown in FIG. 5, the substrate 110 may be a wafer having an orientation flat, which is prepared by slicing an ingot. Thus, the substrate 110 may have a circular shape. In this case, multiple capacitive acceleration sensors 100 are formed in chip regions of the substrate 110.

Thus, the laser beam I is irradiated on the substrate 110, and the focus of the laser beam L is moved, so that multi-photon phenomenon occurs at a position at which the focus of the laser beam I is disposed and laser beam L is irradiated. Thus, the substrate 110 is reformed from single crystal to poly crystal partially. In the reforming step, the laser beam L is locally irradiated at a part of the substrate 110, so that the reformed portion 150 is formed. The substrate 110 is reformed from the single crystal to poly crystal so that the reformed portion 150 is prepared. Thus, a poly crystal region is selectively and partially formed in the substrate 110.

After the reforming step, the poly crystal region of the substrate 110 is etched with the etchant in an etching step. In the etching step, the substrate 110 may be etched by a wet etching method or a dry etching method. The dry etching method is, for example, a reactive gas etching method for etching material in a reactive gas, or a reactive ion etching method for etching material in ionized gas or radical gas, which is prepared with using plasma.

When the substrate 110 is etched by the wet etching method, after the reformed portion 150 is etched and removed from the substrate 110, a sticking phenomenon may occur. When the sticking phenomenon occurs, the substrate 110 near the trench 140a and the release portion 140b sticks together. Thus, the dry etching method may be preferable. When the substrate 110 is etched by the dry etching method, the sticking phenomenon is limited. When a part of the substrate 110 under the movable-electrode-to-be-formed portion, the weight-portion-to-be-formed portion and the spring-portion-to-be-formed portion is etched, it is preferable for the gas used in the dry etching method to penetrate into the release portion 140b, compared with a case where the substrate 110 is etched by the wet etching method with using an etching liquid.

An etching condition of the dry etching method is, for example, such that the gas is $XeF_2$ gas, pressure is 1 Torr, five pulse etching steps are performed, and a reaction chemical formula is shown as $Si + 2XeF_2 => SiF_4 + 2Xe$.

Thus, the poly crystallized portion of the substrate 110, i.e., the reformed portion 150 having the reformed portions 150a, 150b has penetration speed and adsorption speed of the etchant, which is larger than those of single crystal portion of the substrate 110. Accordingly, a part of the substrate 110 is poly crystallized, and then, the poly crystallized portion of the substrate 110 is etched with the etchant sequentially, so that the process time of the etching step is improved. Specifically, the etching speed of the substrate 110 is improved when the sensor 100 made from the single crystal silicon substrate 110 is manufactured.

When the movable portion of the sensor 100 is manufactured, a SOI substrate prepared by bonding two single crystal silicon substrates through an intermediate layer such as an oxide film may be used for manufacturing the sensor 100. However, the SOI substrate is, in general, expensive, compared with the single crystal silicon substrate 110. Thus, in the present embodiment, the sensor 100 is manufactured from the single crystal silicon substrate 110 without using the SOI substrate in such a manner that the part of the substrate 110 for partitioning the movable portion and the fixed portion 130 is poly crystallized, and the poly crystallized part of the substrate 110 is etched. Thus, the sensor 100 having the movable portion movable in a predetermined direction according to the physical quantity applied to the sensor 100 is manufactured with low cost.

The reformed portion 150 in the substrate 110 has an etching rate, which is higher than a single crystal silicon portion of the substrate 110 and an insulation portion such as an oxide film for providing the intermediate layer of the SW substrate. Further, in the present embodiment, the trench 140a and the release portion 140b are sequentially formed in one etching step. Accordingly, the manufacturing method for manufacturing the sensor 100 has a process time, which is shorter than a case where the SOI substrate is used for manufacturing the sensor 100.

Further, in the present embodiment, processed material is only one material, i.e., only the silicon substrate 110. Thus, only one type of a gas system and a chamber system such as a high frequency device and an electrode plate is used. Thus, an etching equipment is simplified.

When the capacitive acceleration sensor 100 is manufactured, the gap between the movable electrode 121 and the fixed electrode 131 may be ideally constant in the substrate 110. Further, the gap in one substrate 110 maybe ideally the same as the gap in another substrate 110. Further, ideally, dimensions of the fixed electrode 131 and the movable electrode 121 are precise in micrometer order. Furthermore, a facing surface of the movable electrode 121 and a facing surface of the fixed electrode 131 may be ideally a mirror finished surface.

In the present manufacturing method, the reformed portion 150 is formed at a region, which is to be etched, with using the laser beam L. Here, the reformed portion 150 is poly crystal and provides a micro dome. Thus, this reforming step is defined as a roughly patterned step. Then, the reforming portion 150 is etched. Thus, the manufacturing accuracy is improved. Further, in the etching step, an angular dependency is effectively utilized so that a processed surface is smooth, compared with a conventional method. Here, the angular dependency is provided by isotropic area of the dry etching method.

Both of the trench 140a and the release portion 140b are formed by the present manufacturing method such that the poly crystallizing step and the etching step are executed. Only the trench 140a may be manufactured by the present manufacturing method. In this case, the process time for forming the trench 140a is shortened, compared with a case where the trench 140a is formed by etching the single crystal substrate 110 directly.

Figure 12A:
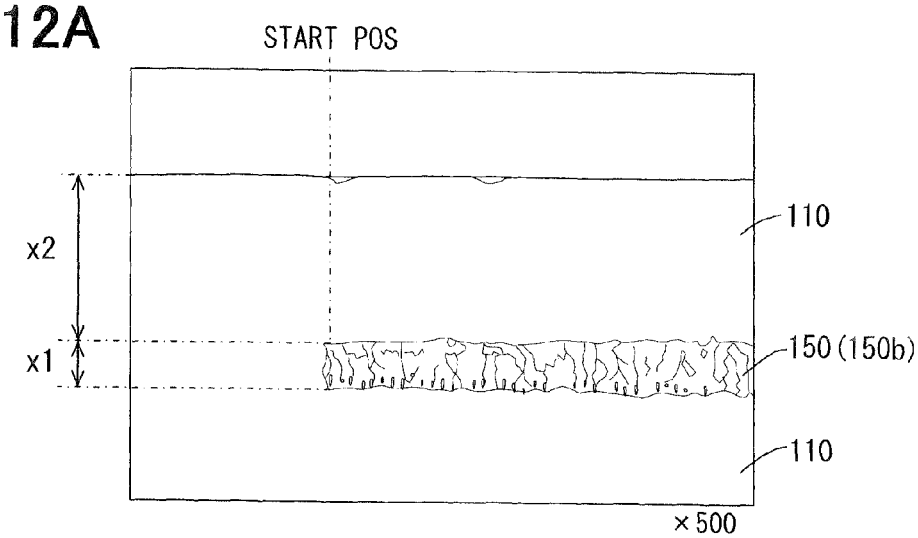
FIG. 12A is a diagram showing an illustrative cross sectional view of a SEM photograph of the single crystal silicon wafer, which is reformed by a laser beam having a power of 0.4 watts.
Figure 13A:
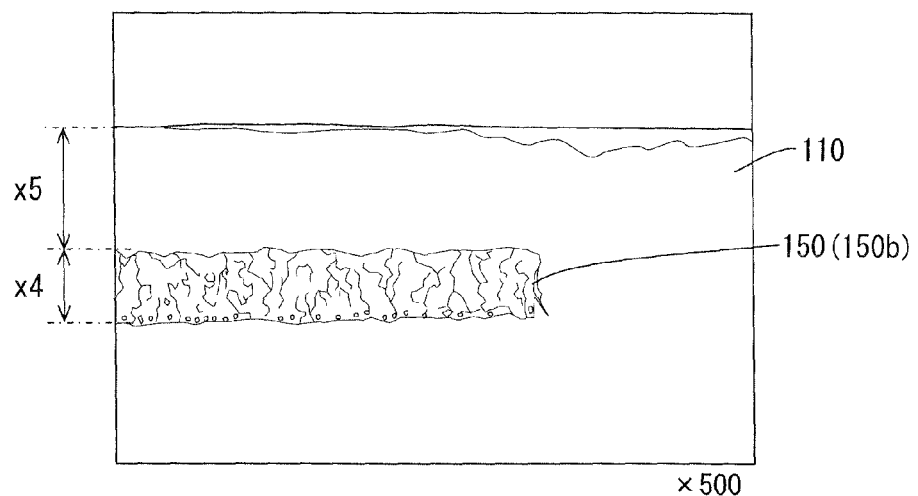
FIG. 13A is a diagram showing an illustrative cross sectional view of a SEM photograph of the single crystal silicon wafer, which is reformed by a laser beam having a power of 1.0 watts.
Figure 13B:
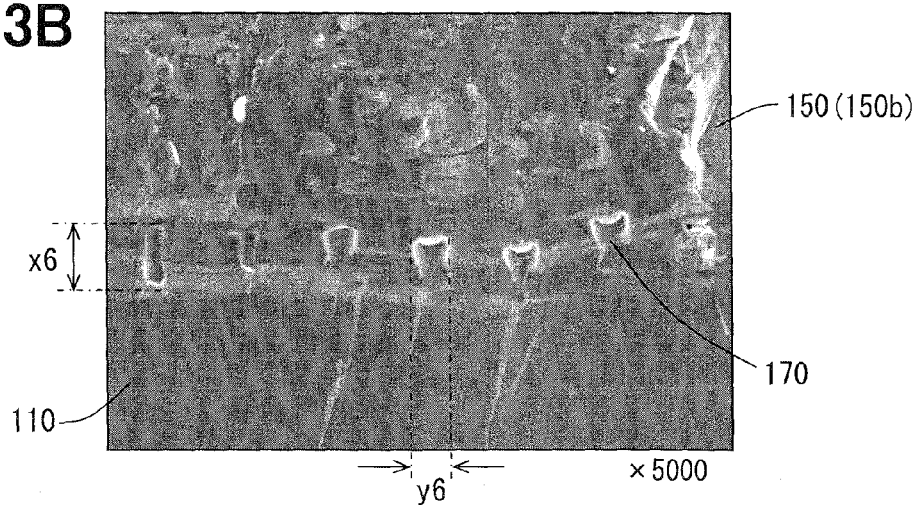
FIG. 13B is a diagram showing a partially enlarged cross sectional view of the SEM photograph in FIG. 13A.
Figure 13C:
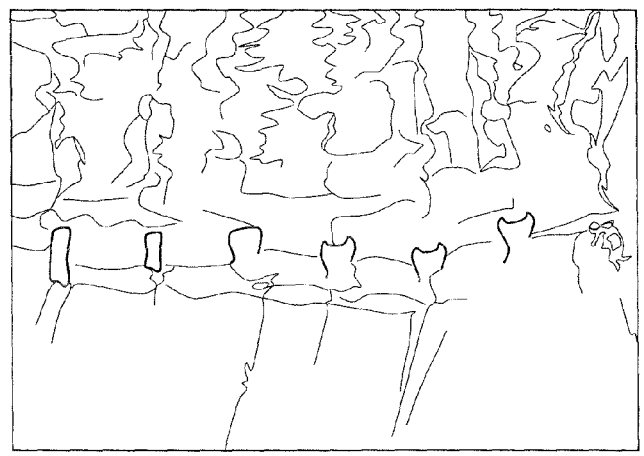
FIG. 13C is a diagram showing a illustrative cross sectional view of the SEM photograph in FIG. 13B.
Figure 14A:
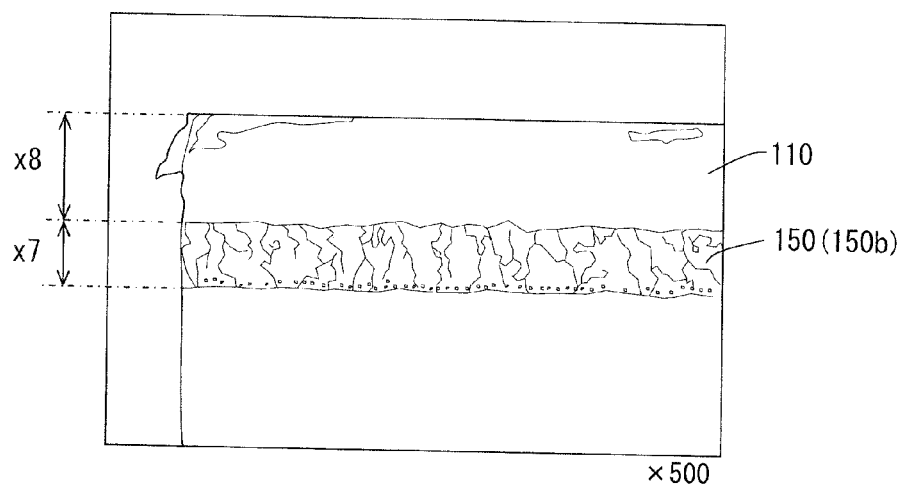
FIG. 14A is a diagram showing an illustrative cross sectional view of a SEM photograph of the single crystal silicon wafer, which is reformed by a laser beam having a power of 1.2 watts.
Figure 14B:
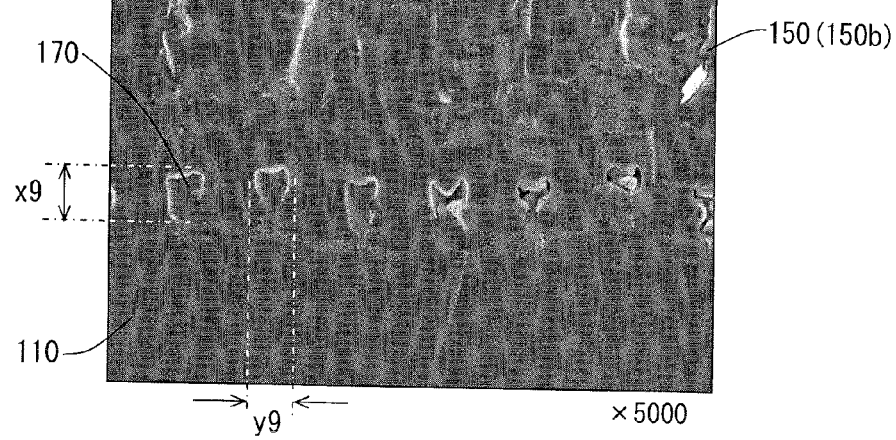
FIG. 14B is a diagram showing a partially enlarged cross sectional view of the SEM photograph in FIG. 14A.
Figure 14C:
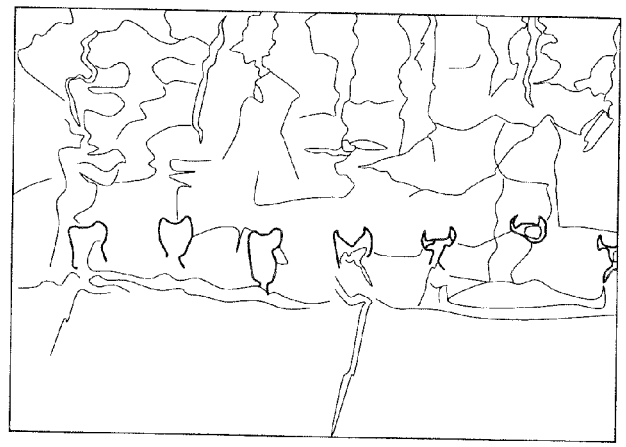
FIG. 14C is a diagram showing a illustrative cross sectional view of the SEM photograph in FIG. 14B.

As shown in FIGS. 12-14, when the irradiation condition of the laser beam L is controlled, a void defined as a micro dome may be formed in a part of the reformed portion 150. Here, FIGS. 12A-14C are SEM photographs and their illustrative diagrams of cross sections of the substrate 110.

Figure 12B:
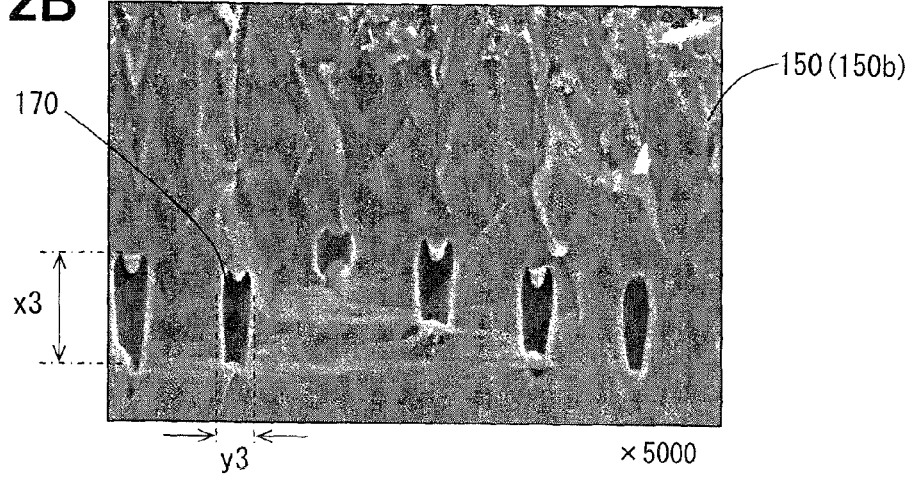
FIG. 12B is a diagram showing a partially enlarged cross sectional view of the SEM photograph in FIG. 12A.
Figure 12C:
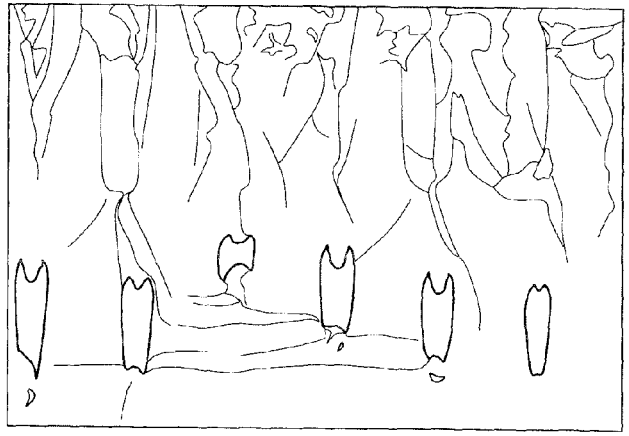
FIG. 12C is a diagram showing a illustrative cross sectional view of the SEM photograph in FIG. 12B.

For example, FIG. 12A shows an illustrative cross sectional view of a FE-SEM photograph of the single crystal silicon wafer, FIG. 12B shows a partially enlarged cross sectional view of the FE-SEM photograph in FIG. 12A, and FIG. 12C shows a illustrative cross sectional view of the FE-SEM photograph in FIG. 12B. The substrate 110 shown in FIGS. 12A to 12C are prepared under a laser beam irradiation condition such that a laser beam power is 0.4 watts, a scanning speed, i.e., a transporting speed is 300 millimeters per second, a frequency is 80 kHz. The reformed portion 150 and a micro dome 170 are formed in the substrate 110. The reformed portion 150 is formed in the substrate 110 at a position from the surface of the substrate 110, and a distance between the position and the surface of the substrate 110 is defined as X2, which is equal to 60 micrometers. The thickness of the reformed portion is defined as X1, which is equal to 15 micrometers. The micro dome 170 is disposed on the bottom of the reformed portion 150, and the thickness of the micro dome in the depth direction is defined as X3, which is equal to 4 micrometers, and the width of the micro dome 170 in the lateral direction of the substrate is defined as Y3, which is equal to 1 micrometer.

For example, FIG. 13A shows an illustrative cross sectional view of a FE-SEM photograph of the single crystal silicon wafer, FIG. 13B shows a partially enlarged cross sectional view of the FE-SEM photograph in FIG. 13A, and FIG. 13C shows a illustrative cross sectional view of the FE-SEM photograph in FIG. 13B. The substrate 110 shown in FIGS. 13A to 13C are prepared under a laser beam irradiation condition such that a laser beam power is 1.0 watts, a scanning speed, i.e., a transporting speed is 300 millimeters per second, a frequency is 80 kHz. The reformed portion 150 and a micro dome 170 are formed in the substrate 110. The reformed portion 150 is formed in the substrate 110 at a position from the surface of the substrate 110, and a distance between the position and the surface of the substrate 110 is defined as X5, which is equal to 45 micrometers. The thickness of the reformed portion is defined as X4, which is equal to 30 micrometers. The micro dome 170 is disposed on the bottom of the reformed portion 150, and the thickness of the micro dome in the depth direction is defined as X6, which is equal to 2 micrometers, and the width of the micro dome 170 in the lateral direction of the substrate is defined as Y6, which is equal to 1 micrometer.

Figure 15:
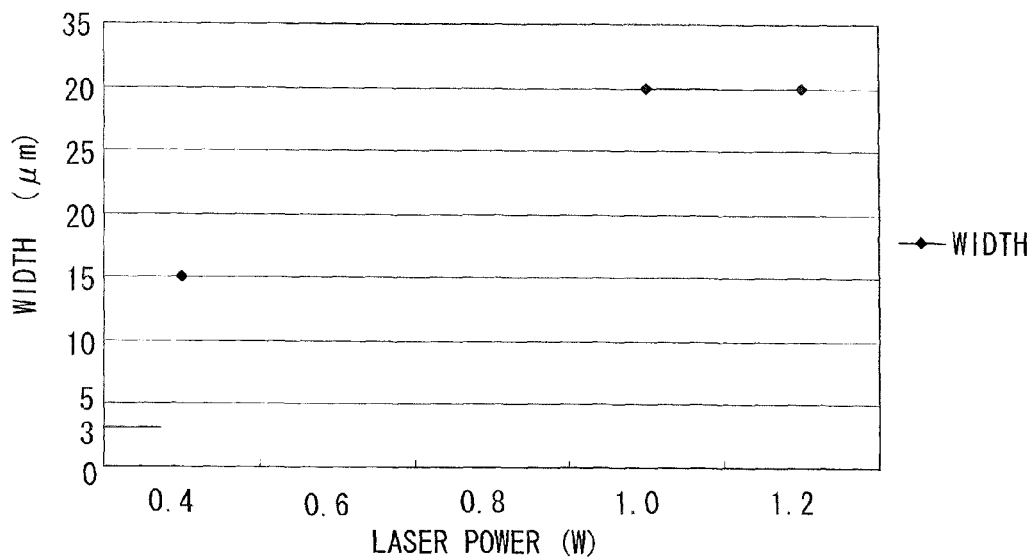
FIG. 15 is a diagram showing a graph of a relationship between a laser beam power and a width of reformed portion.

For example, FIG. 14A shows an illustrative cross sectional view of a FE-SEM photograph of the single crystal silicon wafer, FIG. 14B shows a partially enlarged cross sectional view of the FE-SEM photograph in FIG. 14A, and FIG. 14C shows a illustrative cross sectional view of the FE-SEM photograph in FIG. 14B. The substrate 110 shown in FIGS. 14A to 14C are prepared under a laser beam irradiation condition such that a laser beam power is 1.2 watts, a scanning speed, i.e., a transporting speed is 300 millimeters per second, a frequency is 80 kHz. The reformed portion 150 and a micro dome 170 are formed in the substrate 110. The reformed portion 150 is formed in the substrate 110 at a position from the surface of the substrate 110, and a distance between the position and the surface of the substrate 110 is defined as X8, which is equal to 45 micrometers. The thickness of the reformed portion is defined as X7, which is equal to 30 micrometers. The micro dome 170 is disposed on the bottom of the reformed portion 150, and the thickness of the micro dome in the depth direction is defined as X9, which is equal to 2 micrometers, and the width of the micro dome 170 in the lateral direction of the substrate is defined as Y9, which is equal to 1 micrometer. FIG. 15 shows a graph of a relationship between a laser beam power and a width of the reformed portion 150. The width of the reformed portion 150 is defined as a dimension of the reformed portion 150 in a direction perpendicular to a sheet of the drawings of FIGS. 12A, 13A and 14A.

Under the above irradiation condition of the laser beam L, the micro dome 170 is formed in the reformed portion 150. The dimensions of the reformed portion 150 and the dimensions of the micro dome 170 are controlled by the condition of the laser beam I such as the power and the pulse width of the laser beam L according to a required size such as minimum processing dimensions and a design rule. The micro dome 170 is formed in each of the reformed portion 150a for the trench 140a and the reformed portion 150b for the release portion 140b. The micro dome 170 is arranged in a line by predetermined intervals. When the micro dome 170 is formed in the reformed portion 150, the etchant is easily supplied to the reformed portion 150. Specifically, the penetration speed and the adsorption speed of the etchant are improved, compared with a case where no micro dome 170 is formed in the reformed portion 150. Thus, the etching speed is much improved. The reformed portion 150 having the micro dome 170 in the substrate 110 has the etching speed, which is five times larger than a single crystal portion of the substrate, which is not poly crystallized.

Figure 16:
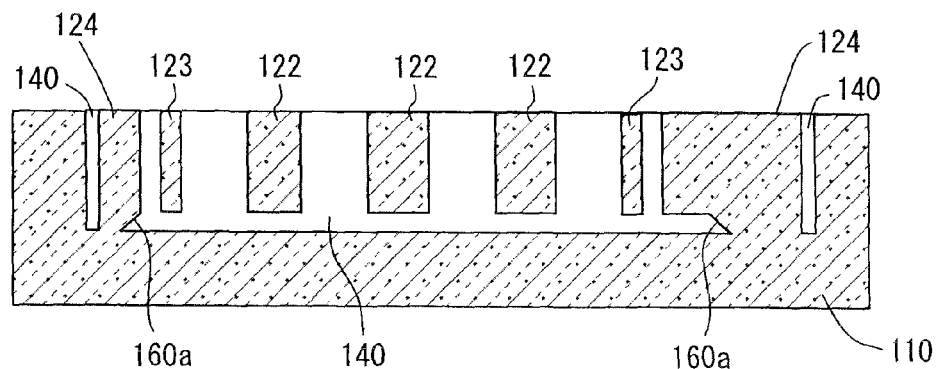
FIG. 16 is a diagram showing a cross sectional view of a semiconductor device according to another example embodiment.
Figure 17:
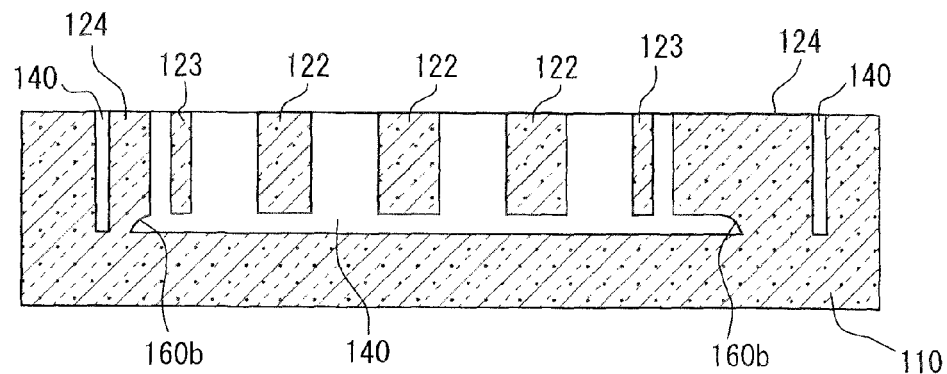
FIG. 17 is a diagram showing a cross sectional view of a semiconductor device according to another example embodiment.

In the above embodiment, the trench 140a and the release portion 140b are formed in the substrate 110. Alternatively, when the reformed portion 150 is formed in the substrate 110, the laser beam focus may be scanned obliquely so that a part of the substrate 110 is poly crystallized obliquely in a direction slant from the surface of the substrate 110. Thus, as shown in FIGS. 16 and 17, a reinforce portion 160a having a tapers shape may be formed at a corner of the release portion 140b and a corner of the trench 140a. Alternatively, the reinforce portion 160b having a curved shape may be formed at a corner of the release portion 140b and a corner of the trench 140a. Specifically, the reinforce portions 160a, 160b have the tapered shape and the curved shape, which are provided by the bottom of the release portion 140b and the trench 140a and a surface facing the bottom. Here, FIGS. 16 and 17 are cross sectional views showing the substrate taken along line XVI-XVI in FIG. 1.

Thus, the reinforce portions 160a, 160b provides to improve the mechanical strength and the durability of the sensor 100. Specifically, the sensor 100 having high mechanical strength and high durability is formed from one single crystal silicon substrate 110.

The manufacturing method may be applied to not only the semiconductor physical quantity sensor but also a trench gate type transistor, and a complex IC. Specifically, a part of the single crystal silicon substrate at which the trench gate is formed maybe poly crystallized. Alternatively, a part of the single crystal silicon substrate at which a separation trench in the complex IC is formed may be poly crystallized. Thus, the transistor having the trench gate and the complex IC are manufactured with low manufacturing cost.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A manufacturing method of a semiconductor device comprising:
   irradiating a laser beam on a single crystal silicon substrate, and scanning the laser beam on the substrate so that a portion of the substrate is poly crystallized, at least a part of the portion of the substrate that is poly crystallized being exposed on a surface of the substrate; and
   etching the portion of the substrate that is poly crystallized with an etchant, wherein,
   in the irradiating and scanning, a laser beam irradiation condition is such that a laser beam power is in a range between 0.1 watts and 1.2 watts, a scanning speed is 300 millimeters per second, and a frequency is 80 kHz, and
   the portion of the substrate that is poly crystallized includes a plurality of dome-shaped voids formed by the irradiating and the scanning under the laser beam irradiation condition.

2. The manufacturing method according to claim 1, wherein the etching is performed by a dry etching method.

3. The manufacturing method according to claim 1, wherein, in the irradiating and scanning, the portion of the substrate is poly crystallized in a depth direction perpendicular to the surface of the substrate and in a lateral direction in parallel to the surface of the substrate.

4. The manufacturing method according to claim 1, wherein, in the irradiating and scanning, the portion of the substrate is poly crystallized in a direction slant from the surface of the substrate.

5. The manufacturing method according to claim 1, wherein the semiconductor device is a semiconductor physical quantity sensor including a movable portion and a fixed portion,
wherein the movable portion is movable in a predetermined direction according to a physical quantity applied to the sensor, and
wherein, in the irradiating and scanning, the poly crystallized portion partitions the movable portion.

6. The manufacturing method according to claim 1, wherein the semiconductor device is a transistor having a trench gate, and
wherein, in the irradiating and scanning, the poly crystallized portion provides the trench gate.

7. The manufacturing method according to claim 1, wherein the irradiating and scanning includes:
moving a focus of the laser beam in a depth direction perpendicular to the surface of the substrate from a predetermined depth of the substrate to the surface of the substrate so that the poly crystallized portion is formed from the predetermined depth to the surface of the substrate; and
moving the focus of the laser beam in a lateral direction in parallel to the surface of the substrate from a predetermined position to another predetermined position so that the poly crystallized portion is formed from the predetermined position to the other predetermined position.

8. The manufacturing method according to claim 7, wherein the poly crystallized portion from the predetermined depth to the surface of the substrate provides a reformed portion for forming a trench,
wherein the poly crystallized portion from the predetermined position to the other predetermined position provides a reformed portion for forming a release portion, and
wherein the semiconductor device includes a movable portion, which is separated from the substrate by the release portion, and surrounded with the trench.

9. The manufacturing method according to claim 8, wherein the etching is performed by a dry etching method, and
wherein the etchant is a reactive gas, a reactive ionized gas or a reactive radical gas.

* * * * *